United States Patent [19]

Miura et al.

[11] Patent Number: 4,674,121

[45] Date of Patent: Jun. 16, 1987

[54] CIRCUIT FOR DETECTING THE LEVEL OF NOISE IN FM SIGNAL FOR USE IN AM/FM RECEIVER

[75] Inventors: Masami Miura; Naotoshi Higashiyama, both of Tokyo, Japan

[73] Assignee: NEC Corporation, Japan

[21] Appl. No.: 777,163

[22] Filed: Sep. 18, 1985

[30] Foreign Application Priority Data

Sep. 18, 1984 [JP] Japan .............................. 59-194971
Oct. 2, 1984 [JP] Japan .............................. 59-206546

[51] Int. Cl.⁴ ............................................. H04H 5/00
[52] U.S. Cl. ....................................... 381/10; 381/11; 381/13
[58] Field of Search ............... 455/142, 143, 144, 223, 455/224; 381/2, 3, 4, 10, 11, 15, 13

[56] References Cited

U.S. PATENT DOCUMENTS

| | | | |
|---|---|---|---|
| 3,728,634 | 4/1973 | Watkinson | 455/143 |
| 4,001,702 | 1/1977 | Kaufman | 455/144 |
| 4,388,496 | 6/1983 | Miyamoto | 455/144 |
| 4,435,618 | 3/1984 | Fujishima | 455/144 |

Primary Examiner—Forester W. Isen
Attorney, Agent, or Firm—Laff, Whitesel, Conte & Saret

[57] ABSTRACT

A circuit is provided for detecting the level of noises in received FM signals in an AM/FM receiver which includes at least an FM intermediate-frequency amplifier, an FM detector connected thereto, an AM intermediate-frequency amplifier and an AM detector connected thereto. This FM noise level detecting circuit includes a frequency converter receiving the output of the FM detector for converting noise components contained in the output of the FM detector into a noise signal of the AM intermediate-frequency, which is in turn outputted to the AM intermediate-frequency amplifier, so that the converted noise signal is amplified by the AM intermediate-frequency amplifier and then detected by the AM detector to produce a DC signal. The signal thus obtained is not only representative of the level of the noise contained in the received FM signal, but also representative of the received FM signal strength.

51 Claims, 10 Drawing Figures

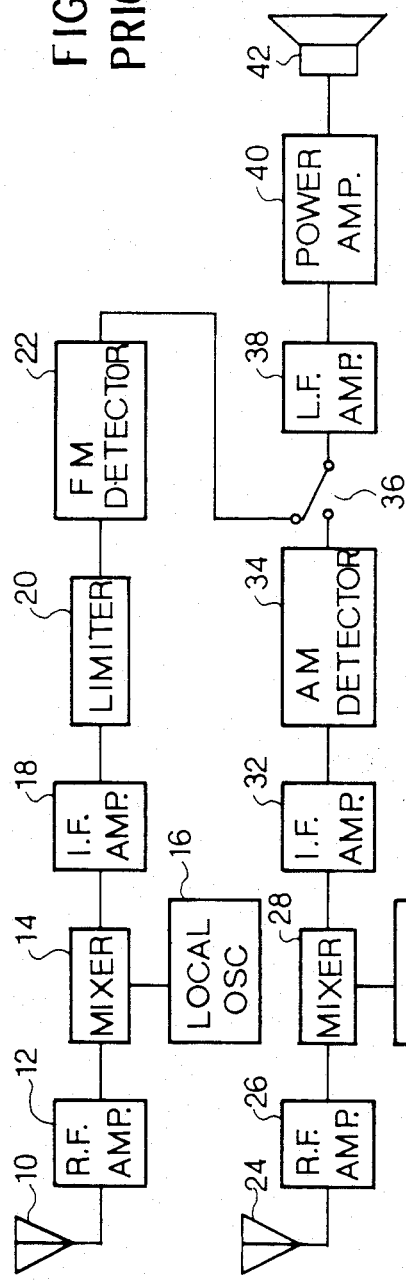
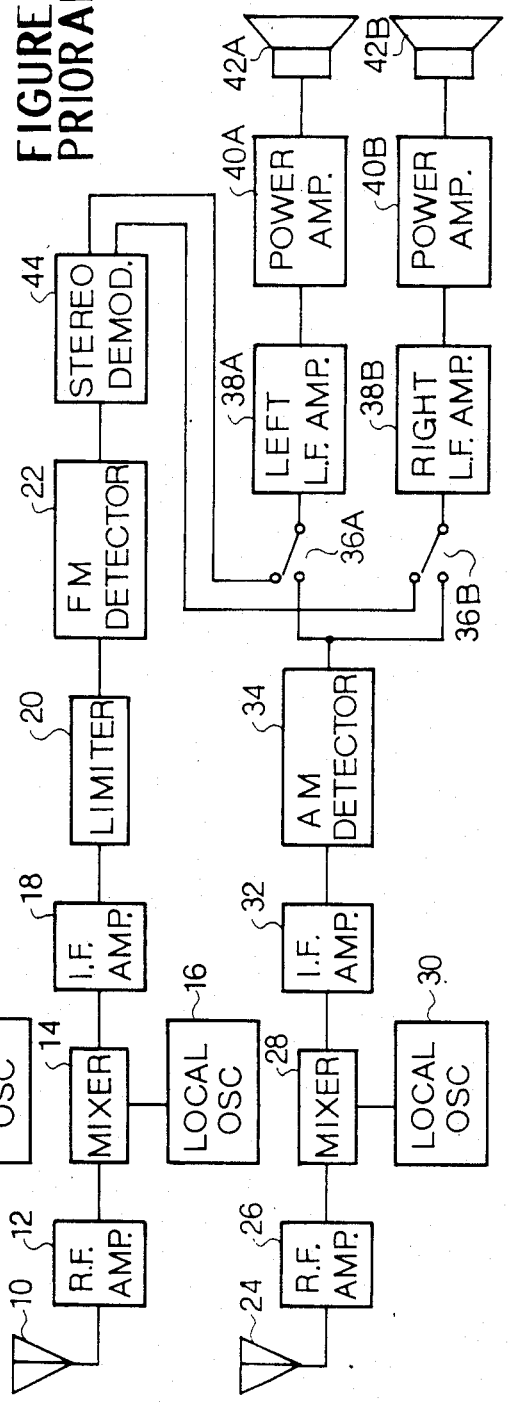

CIRCUIT FOR DETECTING THE LEVEL OF NOISE IN FM SIGNAL FOR USE IN AM/FM RECEIVER

BACKGROUND OF THE INVENTION

1. Field of the Invention

The present invention relates to an AM/FM receiver, and more specifically, to a circuit for detecting the level of noise in a received frequency-modulated (FM) signal, which can be used as an FM signal strength detection circuit in an AM/FM receiver which includes at least an FM intermediate-frequency amplifier, an FM detector connected thereto, an AM intermediate-frequency amplifier and an AM detector connected thereto.

2. Description of the Related Art

Conventionally, in various broadcast receivers such as AM (amplitude modulation) broadcast receivers, FM (frequency modulation) broadcast receivers, AM/FM broadcast receivers, television broadcast receivers, etc., there are used different types of circuits for detecting the level or the field strength of the received signal, for automatic control of various parameters of the receivers such as gain, tuning, etc.

In AM receivers of the superheterodyne type, the output current from an AM detector is representative of the level of a received AM signal, and therefore, the gain of an intermediate-frequency (I.F.) amplifier is ordinarily controlled by feeding back to the intermediate-frequency amplifier a portion of the output current from the AM detector for the purpose of automatic gain or volume control. In certain cases, a portion of the AM detector output is utilized for tuning indication. In any case, the level of the received signal can be detected without adding a substantial circuit to the fundamental circuits indispendable for reception of AM broadcasting.

On the other hand, in FM receivers, it has been considered that the output of an FM detector does not represent the level of a received FM signal because the amplitude of the signal demodulated from the received FM signal is substantially independent upon the amplitude of the received FM signal per se. In order to detect the level of the received FM signal, therefore, a FM signal is sampled from a suitable stage of the FM intermediate-frequency amplifier and rectified by a special circuit to provide a DC voltage representative of the level of the received FM signal. However, since a substantial additional circuit is needed for such a signal processing, the FM receivers had to comprise an increased number of circuit elements and to inevitably become more expensive. Particularly, in the case of detecting the level of the received FM signal by sampling a FM signal from the output of each stage of the FM intermediate-frequency amplifier, rectifying each sampled signal and summing up all the rectified sampled signals, such a signal processing have needed an additional circuit composed of about one half of the intermediate-frequency processing circuit in the number of circuit elements, and therefore, the FM receiver had been at a substantially increased cost.

SUMMARY OF THE INVENTION

In the case that the FM signal strength is detected on the basis of the FM intermediate-frequency signal, a substantial additional circuit is inevitably required. Therefore, the inventors of the present application have made study from various points of view for the purpose of uncovering a new approach for knowing the received FM signal strength. They have found out that a white noise component contained in the FM detector output, particularly a white noise component of not less than 100 KHz is in a predetermined relation to the field strength of the received FM signal or the FM signal strength. Briefly, since ordinary FM receivers include a limiter in the FM intermediate-frequency amplifier, when the received FM signal is of a large strength, the FM signal outputted from the FM intermediate-frequency amplifier contains only a small white noise component suppressed by the action of the limiter. On the other hand, when the received FM signal is of a small strength, the action of the limiter is weakened with the result that the white noise component contained in the FM intermediate-frequency amplifier output is relatively large. This inclination is remarkable in the case of a white noise component of not less than 100 KHz.

Investigating actual receivers capable of listening FM broadcasting, most of these receivers are in the form of an AM/FM receiver, in which the AM receiver section is nullified when the FM receiver section is in an operative condition. In such AM/FM receivers, therefore, it is possible to utilize a portion of the AM receiver section for another purpose when the FM receiver section is in the operative condition.

Accordingly, it is an object of the present invention to provide a circuit for detecting the level of noise in a received FM signal, which can be used as an FM signal strength detecting circuit.

Another object of the present invention is to provide such a FM noise level detecting circuit which can be constructed without requiring a large number of circuit elements.

Still another object of the present invention is to provide a circuit for detecting the noise level of a received FM signal, which can be incorporated as an FM signal strength detecting circuit in an AM/FM receiver with only an additional circuit which does not require a number of circuit elements.

A further object of the present invention is to provide such a circuit for detecting the noise level of a received FM signal, which can be assembled in an AM/FM receiver with a small increase of circuit elements by utilizing a portion of the AM receiver section.

A still further object of the present invention is to provide an AM/FM receiver capable of detecting the received FM signal strength without a substantial increase of circuit elements.

An even further object of the present invention is to provide an AM/FM receiver adapted to detect the level of noise in a received FM signal for detection of the received FM signal strength.

Still another object of the present invention is to provide such an AM/FM receiver in which the noise level of the received FM signal can be detected with an additional circuit formed of a relatively small number of circuit elements by utilizing a portion of the AM receiver section.

The above and other objects of the present invention are achieved by a circuit for detecting the level of noises in received FM signals, for use in an AM/FM receiver which includes at least an FM intermediate-frequency amplifier, an FM detector connected thereto, an AM intermediate-frequency amplifier and an AM detector connected thereto. The circuit comprises, in accordance with one aspect of the present invention, a frequency converting means receiving the output of the FM detector for converting noise components contained in the output of the FM detector into a noise signal of the AM intermediate-frequency and for outputting the converted noise signal to the AM intermediate-frequency amplifier. Thus, the converted noise signal is amplified by the AM intermediate-frequency amplifier and then detected by the AM detector to provide a DC signal representative of the level of the noise contained in the received FM signal.

As mentioned above, the DC signal representative of the level of noise contained in the received FM signal is also representative of the field strength of the received FM signal per se. Therefore, this noise level signal can be used as the FM signal strength information for various purposes such as signal strength indication, the stereophonic signal separation control, the high frequency component suppression control, etc. In addition, this noise signal can be used as it is as the noise information, for example, for the pulse-like noise blanking control.

Furthermore, the above mentioned noise level detecting circuit is constructed by utilizing the AM intermediate-frequency amplifier and the AM detector which are a portions of the AM receiver section. Therefore, it can be assembled in the AM/FM receiver with a relatively small number of circuit elements added to the AM/FM receiver.

In one embodiment, a high-pass filter is connected between the output of the FM detector and the frequency converting means. This high-pass filter has a preselected cut-off frequency so that the frequency converting means is supplied with noise components of frequencies not smaller than the preselected cut-off frequency. Preferably, the preselected cut-off frequency of the high-pass filter is 100 KHz.

Specifically, the high-pass filter includes a high pass filtering circuit consisting of a capacitor connected at its one end to the output of the FM detector and a resistor connected at its one end to the other end of the capacitor, and a Darlington-connected solid state differential amplifier having a first input connected to the connection node between the capacitor and the resistor and a second input connected to the other end of the resistor. The Darlington-connected solid state differential amplifier is grounded through a constant current source.

Furthermore, the frequency converting means can include a local oscillator means for generating a signal of a predetermined frequency different from the center frequency of the AM intermediate-frequency amplifier, and a mixer receiving at its first input the output of the FM detector and at its second input the output signal of the local oscillator for generating the frequency-converted noise signal having substantially the same frequency as the center frequency of the AM intermediate-frequency amplifier.

In a specific embodiment, the mixer includes a level shift circuit having an input connected to receive the output of the FM detector through a first tuned circuit which has a resonance frequency substantially corresponding to the frequency of a noise component to be detected. The level shift circuit is connected at its output to a first input of an analog multiplier whose second input is connected to the local oscillator. This multiplier has an output associated with a second tuned circuit having a resonance frequency corresponding to the center frequency of the AM intermediate-frequency amplifier. The first tuned circuit can include a capacitor, a coil and a resistor connected in parallel to one another. The second tuned circuit can include a capacitor and an intermediate-frequency transformer having a primary coil connected in parallel to the capacitor to form a resonance circuit and also connected to the output terminal of the multiplier. This intermediate-frequency transformer also includes a secondary coil inductively coupled to the primary coil for constituting an input coil of the AM intermediate-frequency amplifier. However, these tuned circuits may be ceramic filters, respectively.

In accordance with another aspect of the present invention, there is provided a circuit for detecting the level of noise in received FM signals, for use in an AM/FM receiver which includes at least an FM intermediate-frequency amplifier, an FM detector connected thereto, a FM stereo demodulator of the phase locked loop type connected to receive the output of the FM detector for reproducing stereophonic signals, an AM intermediate-frequency amplifier and an AM detector connected thereto. The FM stereo demodulator is constructed to have a terminal for outputting a signal of a predetermined frequency which is generated in the course of reproducing the stereophonic signals and which is different from the center frequency of the AM intermediate-frequency amplifier. A mixer is provided to receive at its first input the output of the FM detector and at its second input the predetermined frequency signal from the FM stereo demodulator for converting noise components contained in the output of the FM detector into a noise signal of the AM intermediate-frequency. The converted noise signal is outputted to the AM intermediate-frequency amplifier, so that the converted noise signal is amplified by the AM intermediate-frequency amplifier and then detected by the AM detector thereby to provide a DC signal representative of the level of the noise contained in the received FM signal.

As is apparent from the above, in the case that the AM/FM receiver includes the stereo demodulator of the phase locked loop type, this FM noise level detecting circuit can be constructed by adding only the mixer to the AM/FM receiver. In other words, a considerable portion of the FM noise level detector is common to the conventionally existing circuits of the stereo AM/FM receiver. Therefore, it can be realized in the AM/FM receiver with a very small increase of circuit elements. Namely, the FM signal field strength detecting means can be very inexpensively assembled in the AM/FM receiver.

In a specific embodiment, the FM stereo demodulator includes a phase comparator connected at its one input to the output of the FM decoder and adapted to receive a reference frequency at its second input, a voltage controlled oscillator connected at its input to the output of the phase comparator, and a plurality of series-connected frequency divider stages whose first stage is connected to receive at its input the output of the voltage controlled oscillator. The final stage of the frequency divider stages is connected at its output to the second input of the phase comparator. Furthermore, a stereo decoder is provided to receive the output of the FM detector and the output of a predetermined one of the series-connected frequency divider stages for reproducing the above mentioned stereophonic signals. In such a construction, the second input of the mixer is connected to another predetermined one of the series-connected frequency divider stage from which the above mentioned predetermined frequency signal can be obtained.

Preferably, the voltage controlled oscillator generates a signal of the frequency 608 KHz, and the first stage of the series-connected frequency divider stages is a ½ divider and is connected at its output to the second input of the mixer. In addition, the AM intermediate-frequency amplifier has a center frequency of 450 KHz.

In addition, the output of the voltage controlled oscillator is connected through a high-pass filter and a differential amplifier to the frequency divider. This high-pass filter may includes a high-pass filtering circuit consisting of a capacitor connected at its one end to the output of the voltage controlled oscillator and a resistor connected at its one end to the other end of the capacitor. The differential amplifier is connected at its first input to the connection node between the capacitor and the resistor and at its second input to the other end of the resistor. This differential amplifier is grounded through an active load. An output transistor is connected between the output of the differential amplifier and the input of the first frequency divider stage.

In the series-connected frequency divider stages, the first frequency divider stage can include an input transistor connected to the output transistor of the differential amplifier, and a toggle flipflop having a single input connected to the input transistor and a pair of output terminals adapted to supply output signals opposite in phase to each other.

Further, the mixer can include a double-balanced differential amplifier type analog multiplier having a pair of first inputs connected to the pair of output terminals of the toggle flipflop in the first frequency divider stage and a second input connected to the FM detector. This multiplier also has an output associated with a tuned circuit having a resonance frequency corresponding to the center frequency of the AM intermediate-frequency amplifier. Specifically, the multiplier has a pair of output terminals, and the turned circuit includes a capacitor and an intermediate-frequency transformer having a primary coil connected in parallel to the capacitor to form a resonance circuit and also connected across the pair of output terminals of the multiplier. The intermediate-frequency transformer also includes a secondary coil inductively coupled to the primary coil for constituting an input coil of the AM intermediate-frequency amplifier.

In accordance with a third aspect of the present invention, there is provided an AM/FM receiver which includes an AM receiver section, an FM receiver section and an audio outputting section. The AM receiver section has at least an AM frequency converter for converting a received radio frequency AM signal into an AM intermediate-frequency signal, an AM intermediate-frequency amplifier for amplifying the converted AM intermediate-frequency signal, and an AM detector for demodulating the amplified AM intermediate-frequency signal to reproduce an low-frequency signal. The FM receiver section includes at least an FM frequency converter for converting a received radio frequency FM signal into an FM intermediate-frequency signal, an FM intermediate-frequency amplifier for amplifying the converted FM intermediate-frequency signal, and an FM detector for demodulating the amplified FM intermediate-frequency signal to reproduce a low-frequency signal. The audio outputting section comprises a low-frequency amplifier selectively receiving either the output of the AM detector or the output of the FM detector and for amplifying the received low-frequency signal, and electroacoustic transducing means receiving the amplified low-frequency signal for converting it into an acoustic output. Furthermore, as a feature of the present invention, there is provided a circuit receiving, when the FM receiver section is in an operative condition, the output of the FM detector for converting noise components contained in the output of the FM detector into a noise signal of the AM intermediate-frequency and for outputting the converted noise signal to the AM intermediate-frequency amplifier, so that the converted noise signal is amplified by the AM intermediate-frequency amplifier and then detected by the AM detector thereby to provide a signal representative of the level of the noise contained in the received FM signal.

In the case that the AM/FM receiver is of the stereo type, it can further includes a stereo demodulator of the phase locked loop type receiving the output of the FM detector for generating a pair of stereophonic signals. In this case, the low frequency amplifier includes a pair of amplifiers which receive and amplify the pair of stereophonic signals, respectively, and the electroacoustic transducing means includes at least a pair of electroacoustic transducers receiving the pair of amplified stereophonic signals. Further, in accordance with the present invention, the FM stereo demodulator is made to have a terminal for outputting a signal of a predetermined frequency which is generated in the course of reproducing the stereophonic signals and which is different from the center frequency of the AM intermediate-frequency amplifier. In addition, the FM noise level detecting circuit includes a mixer receiving at its first input the output of the FM detector and at its second input the predetermined frequency signal from the FM stereo demodulator for converting noise components contained in the output of the FM detector into the signal of the AM intermediate-frequency.

In one specific embodiment, the AM/FM receiver further includes noise blanking means located between the output of the FM detector and the low frequency amplifier for eliminating pulse-like noises from the output signal of the FM detector. This noise blanking means is controlled by the signal from the FM noise level detecting circuit. In another embodiment, the stereo decoder includes a stereo separation controller adapted to adjust the degree of stereo separation on the basis of the output from the FM noise level detecting circuit so that the degree of stereo separation is forcedly decreased when the received FM signal is not greater than an intermediate field strength. In addition, the stereo decoder can further include a high frequency component eliminating circuit controlled on the basis of the output from the FM noise level detecting circuit so that a high frequency component is more strongly suppressed when the received FM signal is not greater than a small field strength.

The above and other objects, features and advantages of the present invention will be apparent from the following description of preferred embodiments of the invention with reference to the accompanying drawings.

BRIEF DESCRIPTION OF THE DRAWINGS

FIG. 1 is a block diagram showing a fundamental overall construction of a conventional monophonic AM/FM broadcasting receiver;

FIG. 2 is a diagram similar to FIG. 1 but showing a conventional stereophonic AM/FM broadcasting receiver;

DESCRIPTION OF THE PREFERRED EMBODIMENTS

Figure 3:
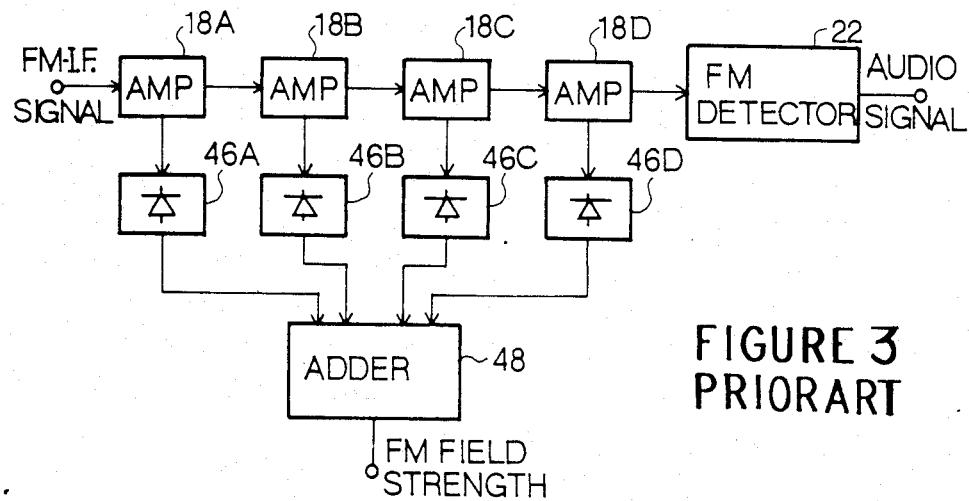
FIG. 3 is a block diagram showing a conventional circuit for detecting the field strength of a received FM signal.

Referring to the FIG. 1, there is shown a block diagram of an overall construction of a conventional monophonic AM/FM broadcast receiver. As shown in the drawing, the AM/FM receiver fundamentally comprises an AM receiver section, an FM receiver section and an audio outputting section. The FM receiver section includes an antenna 10 connected to an input of a radio frequency amplifier 12, whose output is in turn connected to one input of a mixer 14. This mixer 14 has another input connected to a local oscillator 16. These circuits 12, 14 and 16 constitute a so-called front end which operate to select one of incoming FM broadcasting signals in a frequency range of for example 76 to 108 MHz by the action of associated variable tuning circuits, and then to frequency-connect the selected FM signal into an intermediate-frequency signal of for example 10.7 MHz.

This intermediate-frequency FM signal is amplified by an intermediate-frequency amplifier 18 and is amplitude-limited by a limiter 20, so that there is obtained an intermediate-frequency FM signal having an amplitude not greater than a predetermined level, irrespectively of the strength of the received radio frequency FM signal. The intermediate-frequency FM signal thus obtained is supplied to an FM detector where the FM signal is demodulated to an audio signal or a so-called stereo composite signal.

On the other hand, the AM recevier section includes an antenna 24 and a radio frequency amplifier 26 connected at its input to the antenna 24 and at its output to one input of a mixer 28. This mixer 28 has another input connected to a local oscillator 30. These circuits 26, 28 and 30 cooperate to select one of incoming AM broadcasting signals in a frequency range of for example 580 to 1700 KHz by the action of associated variable tuning circuits, and then to frequency-convert the selected AM signal into an intermediate-frequency signal of for example 450 KHz.

This intermediate-frequency AM signal is fed to an intermediate-frequency amplifier 32 where it is amplified to an AM signal having a sufficient amplitude. The intermediate-frequency AM signal is envelope-detected by an AM detector 34 which is formed of for example a diode, so that an audio signal is reproduced.

Either the output of the FM detector or the output of the AM detector is coupled through a selective switch 36 to the audio outputting section which includes a low frequency amplifier 38, a power amplifier 40 and an electroacoustic transducer 42 such as a loudspeaker.

Turning to FIG. 2, there is shown a stereo AM/FM receiver, in which the portions similar to those of the receiver shown in FIG. 1 are given the same Reference Numerals and an explanation thereon will be omitted. As seen from comparison between FIGS. 1 and 2, the stereo AM/FM receiver further includes a stereo demodulator 44 connected to receive the output of the FM detector 22 and adapted to generate a pair of stereophonic audio signals, which are in turn fed through a pair of selecting switches 36A and 36B to a pair of low frequency amplifiers 38A and 38B, respectively. These low frequency amplifiers 38A and 38B are connected at their outputs to a pair of power amplifiers 40A and 40B, respectively, which are also connected to a pair of loudspeakers 42A and 42B.

The AM/FM receivers as mentioned above often have a circuit for detecting the field strength of a received FM signal. FIG. 3 shows one typical type of the FM signal strength detecting circuit, which includes four rectifier circuits 46A, 46B, 46C and 46D connected to four series-connected amplifier stages 18A, 18B, 18C and 18D of the FM intermediate-frequency amplifier 18, respectively. Outputs of these rectifier circuits are connected to an analog adder 48. With this arrangement, an FM intermediate-frequency signal is sampled from each of the amplifier stages 18A, 18B, 18C and 18D and then rectified by the associated rectifier circuit 46A, 46B, 46C and 46D. The direct current signals thus obtained are combined in the analog adder 48 to provide a summed direct current signal, which is representative of the field strength of the received FM broadcast signal.

The above mentioned FM signal field strength detecting circuit comprises four rectifier circuits and one four-input analog adder. Such a detecting circuit needs about one half of the required circuit element numbers of the FM intermediate-frequency amplifier, and therefore, has made the AM/FM receiver more expensive.

Figure 4:
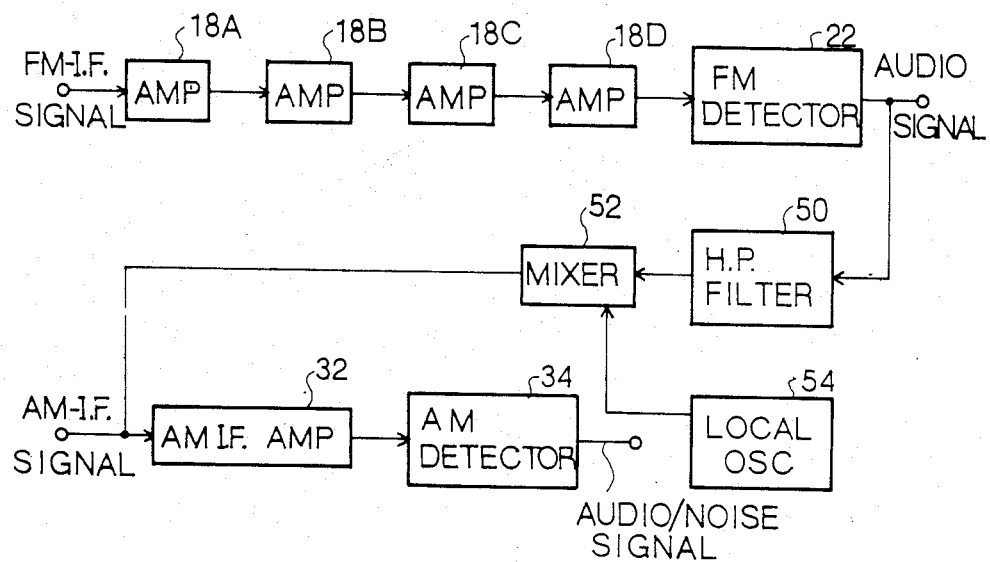
FIG. 4 is a block diagram showing a first embodiment of the circuit for detecting the level of the noise in a received FM signal, constructed in accordance with the present invention.

Turning to FIG. 4, there is shown one embodiment of the FM noise level detecting circuit in accordance with the present invention which can be used as the FM signal field strength detecting circuit. In FIG. 4, portions similar to those of the circuit or the receiver shown in FIGS. 1, 2 and 3 are given the same Reference Numerals.

The shown FM noise level detecting circuit includes a high-pass filter 50 connected to receive the output of the FM detector 22. This high-pass filter 50 has a cut-off frequency of for example 100 KHz, and is connected at its output to a first input of a mixer 52. Therefore, only a noise component of not less than 100 KHz, which is contained in the output of the FM detector 22 but which have excluded an audio signal component, is selected and applied to the mixer 52. As mentioned hereinbefore, the level of such a noise compoment is substantially indicative of the field strength of the received FM signal. The mixer 62 also has a second input connected to a local oscillator 54 adapted to generate a signal of for example 300 KHz. In addition, the output of the mixer 52 is connected to the input of the AM intermediate-frequency amplifier 32.

As is apparent to persons skilled in the art, the mixer 52 and the local oscillator 54 constitute a frequency converter. As mentioned hereinbefore, since the center frequency of the AM intermediate-frequency amplifier is 450 KHz, the white noise component of 150 KHz (450 KHz−300 KHz) is converted into a noise signal of 450 KHz by the action of the mixer 52 receiving the signal of 300 KHz at its second input. Specifically, the AM intermediate-frequency amplifier 32 ordinarily has the bandwidth of ±10 KHz, and therefore, the noise component of 150±10 KHz is picked up and frequency-converted into the noise signal of 450±10 KHz. This noise signal is amplified by the AM intermediate-frequency amplifier 32 and then rectified by the AM detector 34, so that there is outputted a direct current signal representative of the noise level in the received FM signal, which is in the predetermined relation to the FM signal field strength as mentioned above.

In the above embodiment, the mixer 52 converts the noise component to be detected into the noise signal of the frequency equal to the sum of the local oscillator frequency and the frequency of the noise component to be detected. However, it can be constructed that the mixer 52 converts the noise component into the noise signal of the frequency equal to the difference between the local oscillator frequency and the noise component to be detected. In this case, the noise component to 150 KHz can be picked up by using a local oscillator of 600 KHz.

Figures 5, 5A:
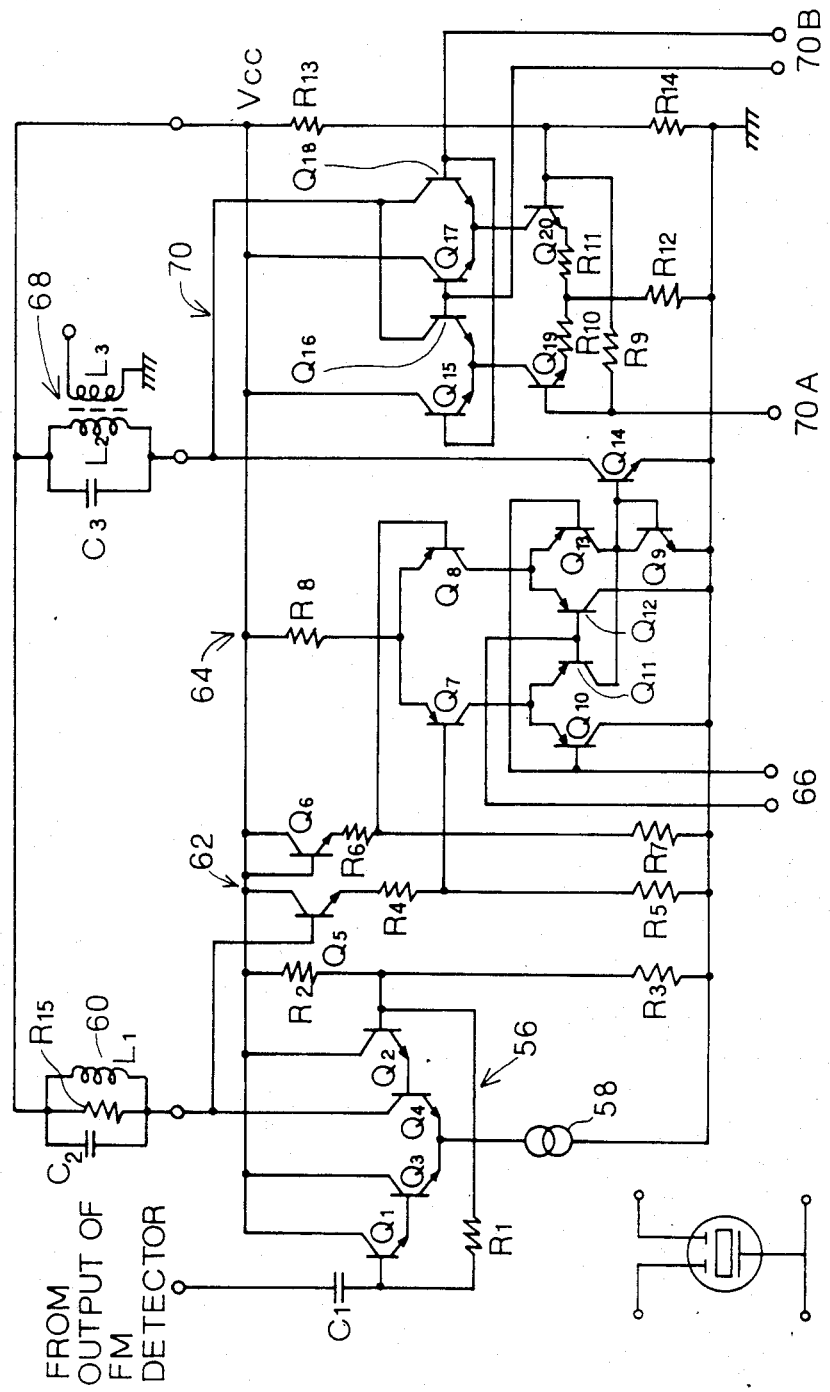
FIG. 5 is a specific circuit diagram of a portion of the FM noise level detecting circuit shown in FIG. 4.
FIG. 5A shows a ceramic filter which can be used in place of the tuned intermediate-frequency transformer.

Referring to FIG. 5, there is shown a specific circuit diagram of the high-pass filter 50 and the mixer 52 as well as the mixer 28 of the AM receiver section.

As shown in the drawing, the high-pass filter 50 includes a high pass filtering circuit consisting of a capacitor $C_1$ connected at its one end to the output of the FM detector and a resistor $R_1$ connected at its one end to the other end of the capacitor. The connection node between the capacitor $C_1$ and the resistor $R_1$ is connected to a base of a transistor $Q_1$. This transistor $Q_1$ is connected to transistors $Q_2$, $Q_3$ and $Q_4$ as shown in FIG. 5 to constitute a Darlington-connected differential amplifier 56 and functions as a first input of the differential amplifier 56. The other end of the resistor $R_1$ is connected to a base of the transistor $Q_2$, i.e., the second input of the differential amplifier 56. The base of the transistor $Q_2$ is biased by a voltage dividing circuit consisting of a series-connected resistors $R_2$ and $R_3$. The emitters of the transistors $Q_3$ and $Q_4$ are common-connected to a constant current source 58. The collectors of the transistors $Q_1$, $Q_2$ and $Q_3$ are connected to a positive voltage $V_{cc}$.

The collector of the transistor $Q_4$ which constitutes an output of the differential amplifier 56 is connected to the positive voltage $V_{cc}$ through a tuned circuit 60 which functions as a load having a resonance frequency of 150 KHz corresponding to the frequency of the noise component to be detected. As shown in FIG. 5, this tuned circuit 60 can be formed of a parallel resonance circuit including a capacitor $C_2$, a coil $L_1$ and a resistor $R_{15}$. But, the tuned circuit 60 may be a two-terminal ceramic filter similar to a ceramic filter CF shown in FIG. 7. In addition, a simple resistor may be connected to the output of the differential amplifier 56 in place of the tuned circuit 60. But the tuned circuit 60 consisting of $C_2$, $L_1$ and $R_{15}$ is more preferable than a simple resistor, because the tuned circuit 60 makes easy the direct current coupling between the output of the differential amplifier and an input of the succeeding stage, and because the tuned circuit 60 can effectively present leakage of the FM intermediate-frequency signal component. In other words, the tuned circuit 60 provides a larger degree of freedom in circuit design and can increase the characteristics of the circuit.

The mixer 52 includes a level shift circuit 62 and an analog multiplier 64. The level shift circuit 62 has a transistor $Q_5$ whose base is connected to the collector of the transistor $Q_2$. The emitter of the transistor $Q_5$ is grounded through a series-connected resistors $R_4$ and $R_5$ so that a level shifted signal can be obtained from the connection node between the resistors $R_4$ and $R_5$. Further, there is provided a constant voltage source including a transistor $Q_6$ whose base and collector are connected to the positive voltage $V_{cc}$. The emitter of the transistor $Q_6$ is grounded through a series-connected resistors $R_6$ and $R_7$ so that a predetermined constant voltage is outputted from the connection node between the resistors $R_6$ and $R_7$.

The analog multiplier 64 comprises a resistor $R_8$ and transistors $Q_7$, $Q_8$, $Q_9$, $Q_{10}$, $Q_{11}$, $Q_{12}$, $Q_{13}$ and $Q_{14}$ connected to form a double-balanced differential amplifier as shown in FIG. 5. Specifically, the transistors $Q_7$ and $Q_8$ constitute one input of the analog multiplier 64 with the base of the transistor $Q_7$ being connected to the connection between resistors $R_4$ and $R_5$ and the base of the transistor $Q_8$ being connected to the connection between the resistors $R_6$ and $R_7$. The emitter of these transistors $Q_7$ and $Q_8$ is common-connected to one end of the resistor $R_8$ whose other end is connected to the positive voltage $V_{cc}$.

The collector of the transistor $Q_7$ is connected to common-connected emitters of the transistors $Q_{10}$ and $Q_{11}$ while the collector of the transistor $Q_8$ is connected to common-connected emitters of the transistors $Q_{12}$ and $Q_{13}$. The bases of these transistors $Q_{10}$, $Q_{11}$, $Q_{12}$ and $Q_{13}$ are cross-connected as shown in the drawing to form a second input 66 of the multiplier 66 for receiving the signal from the local oscillator 54. Namely, the bases of the transistors $Q_{10}$ and $Q_{13}$ are common-connected to form one terminal of the second input 66 and the bases of the transistors $Q_{11}$ and $Q_{12}$ are common-connected to form the other terminal of the second input 66. The collectors of the transistors $Q_{10}$ and $Q_{12}$ are grounded, and the collectors of the transistors $Q_{11}$ and $Q_{12}$ are common-connected to the transistor $Q_9$ constituting an active load and also connected to the base of the output transistor $Q_{14}$ whose emitter is grounded.

The collector of the transistor $Q_{14}$ is the output of the multiplier 64 and is connected to the positive voltage $V_{cc}$ through another tuned circuit 68 which has a resonance frequency corresponding to the center frequency of the AM intermediate-frequency amplifier. Practically, the tuned circuit 68 includes a capacitor $C_3$ and an intermediate-frequency transformer having a primary coil $L_2$ connected in parallel to the capacitor $C_3$ so as to form a LC parallel resonance circuit. The intermediate-frequency transformer also includes a secondary coil $L_3$ inductively coupled to the primary coil $L_2$ and adapted to form an input coil of the AM intermediate-frequency amplifier. In other words, the tuned circuit 68 is an input AM intermediate-frequency transformer. But, this tuned circuit 68 can be constituted by a four-terminal ceramic filter as shown in FIG. 5A.

The mixer 28 of the AM receiver section comprises an analog multiplier 70 constituted of transistors $Q_{15}$, $Q_{16}$, $Q_{17}$, $Q_{18}$, $Q_{19}$ and $Q_{20}$ and resistors $R_9$, $R_{10}$, $R_{11}$, $R_{12}$, $R_{13}$ and $R_{14}$ connected as shown in FIG. 5. A first input 70A of this multiplier 70 is adapted to receive the output of the radio-frequency amplifier 26, and a second input 70B of the multiplier is adapted to receive the output of the local oscillator 30. In addition, the output of the multiplier 70 is common-connected to the output of the multiplier 64. But, this mixer 28 is rendered inoperative when the AM/FM receiver is in an FM broadcasting receiving mode, so that only the output of the mixer 52 is coupled through the tuned circuit 68 to the AM intermediate-frequency ampliifer.

With this arrangement, the noise component of not less than 100 KHz is derived from the output of the FM detector by the action of the high-pass filtering circuit of $C_1$ and $R_1$ and the differential amplifier 56. Then, only the noise component of 150 KHz is selected and converted, by the cooperation of the analog multiplier 64 and the tuned circuits 60 and 68, into the intermediate-frequency signal, which will in turn be coupled through the tuned circuit 68 to the AM intermediate-frequency amplifier 32.

As mentioned hereinbefore, if the AM/FM receiver includes a stereo demodulator of the phase locked loop type, the local oscillator frequency signal for the mixer 52 can be obtained from the phase loop without provision of an independent local oscillator.

Figure 6:
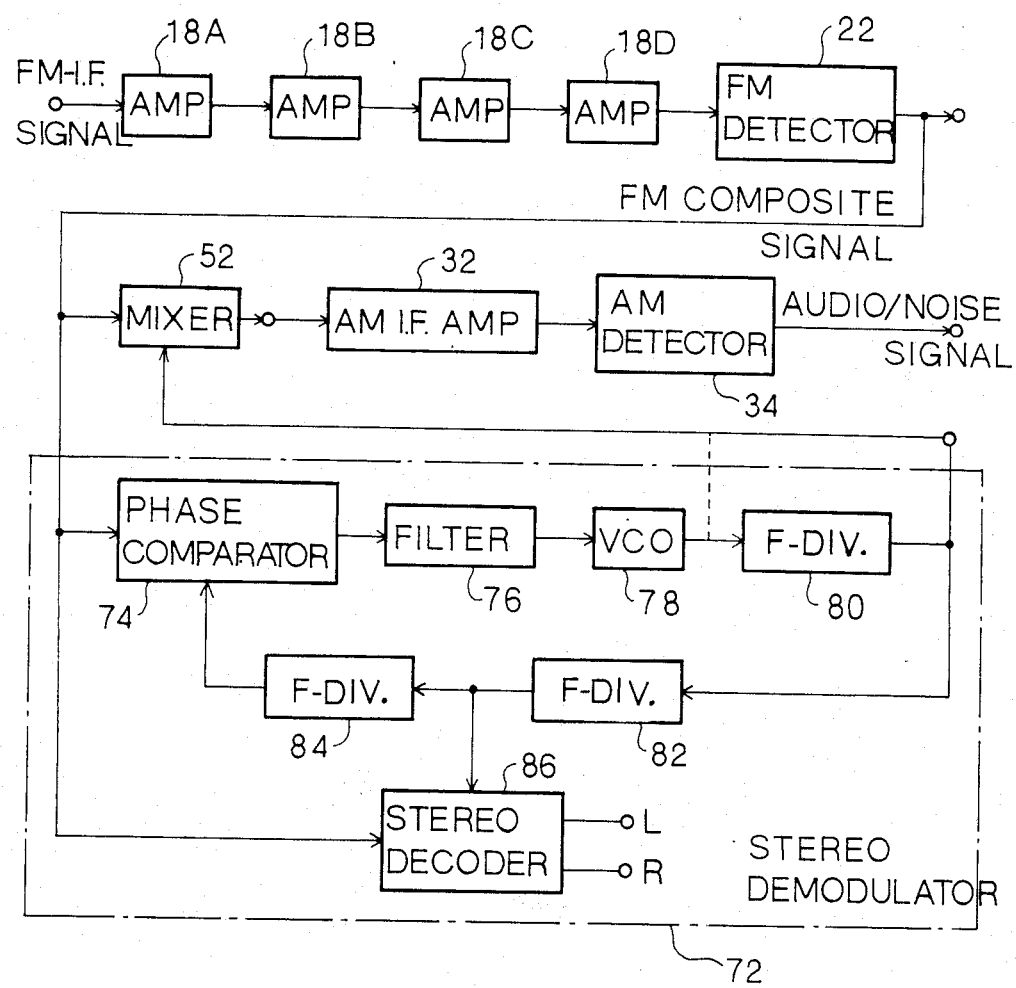
FIG. 6 is a diagram similar to FIG. 4 but showing a second embodiment of the FM noise level detecting circuit.

Turning to FIG. 6, there is shown a second embodiment of the FM noise level detecting circuit which reduces in practice the above thought. In FIG. 6, portions corresponding to those shown in FIG. 4 are given the same Reference Numerals, and explanation thereon will be omitted.

When the stereo AM/FM receiver is in reception of a stereo FM broadcasting, the output of the FM detector 22 contains an FM composite signal composed of at least a so-called sum signal (lefthand signal plus righthand signal) on the main channel, a difference signal (lefthand signal minus righthand signal) on the subcarrier of 38 KHz, and a pilot signal of 19 KHz. The output of the FM detector 22 also contains white noise components.

For stereophonic signal reproduction, such an output of the FM detector is fed to a stereo demodulator 72 of the phase locked loop type, which includes a phase comparator 74 having a first input connected to receive the output of the FM detector 22. The phase comparator 74 has an output connected through a loop filter (low-pass filter) 76 to a voltage controlled oscillator (VCO) 78. The output of the oscillator 78 is frequency-divided through three series-connected frequency dividers 80, 82 and 84 to a signal of 19 KHz, which is in turn supplied to a second input of the phase comparator 74. Thus, the phase comparator 74 outputs a voltage signal representative of the phase difference between the pilot signal contained in the FM detector output and the output of the frequency divider 84. The voltage signal is applied through the loop filter 76 to the voltage controlled oscillator 78, so that the output frequency of the oscillator 78 is controlled on the basis of the voltage signal. As a result, the two inputs of the phase comparator 74 are rendered consistent in phase and in frequency. This is the phase locked condition, and the output of the frequency divider 84 becomes 19 KHz in phase to the pilot signal contained in the stereo composite signal.

The stereo demodulator 72 also includes a stereo decoder 86 connected at its input to the output of the FM detector 22. This stereo decoder 86 has an control input connected to an input of the frequency divider 84 for receiving a signal of 38 KHz when the phase locked loop is in a locked condition. Specifically, the stereo decoder 86 includes a multiplexer which acts to switch over the composite signal to a lefthand signal output L and a righthand signal output R in synchronism with the signal of 38 KHz.

In the stereo demodulator 72 as mentioned above, the voltage controlled oscillator 78 ordinarily generates signal of 608 KHz or 456 KHz. Therefore, in the case of 608 KHz, the first frequency divider 80 is formed by a ½ divider and the output of the divider 80 is connected to the second input of the mixer 52, so that a signal of 304 KHz is applied as a local oscillator signal to the mixer 52. As a result, a noise component of 146 KHz contained in the FM detector output is converted into a noise signal of 450 KHz and is selected and inputted to the AM intermediate-frequency amplifier 32.

Next, the construction of the frequency dividers 80, 82 and 84 will be received. Now, assuming that the AM intermediate-frequency amplifier 32 has the passband of $450 \pm 10$ KHz and that the frequency of the white noise component to be detected is $f_1$, the frequency of the second input of the mixer 52 should be as follows:

$$f_{2L} = 450 + f_1 \qquad (1)$$

or $$f_{2U} = 450 + f_1 \qquad (2)$$

where $f_{2L}$ is the frequency of the mixer second input when the difference signal is selected by the AM intermediate-frequency amplifier. $f_{2U}$ is the frequency of the mixer second input when the sum signal is selected.

In order to receive a signal of the frequency $f_{2L}$ or $f_{2U}$ from the stereo demodulator 72 of the phase locked loop type, it is preferable that $f_{2L}$ or $f_{2U} = 19 \times N$ (where N = integer). If the frequency $f_{2L}$ or $f_{2U}$ is selected to fulfil the following relation:

$$f_{2L} \text{ (or } f_{2U}) = 19 \times 2^n \qquad (3)$$

where
n = integer
the frequency dividers 80, 82 and 84 can be simplified in circuit construction.

On the other hand, there is a recent inclination that the stereo demodulator becomes a adjustment-free type. In such a stereo demodulator, the voltage controlled oscillator ordinarily uses a ceramic resonator having a very high Q and a very slight deviation of frequency. In addition, from the point of the characteristics of commercially available ceramic resonators, the voltage controlled oscillator is generally designed to produce a signal of 608 KHz or 456 KHz as mentioned hereinbefore.

Therefore, if there is adopted the voltage controlled oscillator of generating a signal of 608 KHz, the switching signal of 38 KHz can be obtained by causing the frequency dividers 80 and 82 to perform the frequency division of 1/16 (38 KHz/608 KHz) in total. Since $1/16 = \frac{1}{2}^4$, the dividers 80 and 82 are formed of four series-connected ½ frequency dividers.

On the other hand, the frequency $f_1$ in the above equations (1) and (2) will be not less than 100 KHz for the purpose of detecting a white noise component of not less than 100 KHz. Under this condition, the frequency $f_1$ of 608 KHz can fulfil the equation (1), and if 608 KHz is halved it can fulfil the equation (2). In any case, the frequency $f_{2L}$ and $f_{2U}$ can be derived from the output of the voltage controlled oscillator 78 through no intermediary of a frequency divider or through the intermediary of a frequency divider. Therefore, it becomes unnecessary to prepare an independent local oscillator for a signal source for the second input of the mixer 52. As a result, the cost of the AM/FM receivers can be greatly decreased.

Under the aforementioned condition, it is so designed that the first frequency divider 80 is a ½ divider, the second frequency divider 82 is a ⅛ divider, and the third divider 84 is a ½ divider. In this case, the signal of 304 KHz is applied to the second input of the mix 52. Therefore, the frequency $f_1$ of white noise components to be detected is expressed:

$$f_1 = 450 - 304 = 146 \text{ (KHz)}$$

Accordingly, the white noise component of $146 \pm 10$ KHz is converted into the AM intermediate-frequency and amplified by the AM intermediate-frequency amplifier 32, and then rectified by the AM detector 34 to provide a DC voltage signal representative of the FM noise level, and hence the field strength of the received FM signal.

Instead of the output of the first frequency divider 80, the output of the voltage controlled oscillator can be applied to the second input of the mixer 52 as shown in a dotted line in FIG. 6. In this case, the frequency $f_1$ of white noise component to be detected is expressed as follows:

$$f_1 = 608 - 450 = 158 \text{ (KHz)}$$

Figure 7:
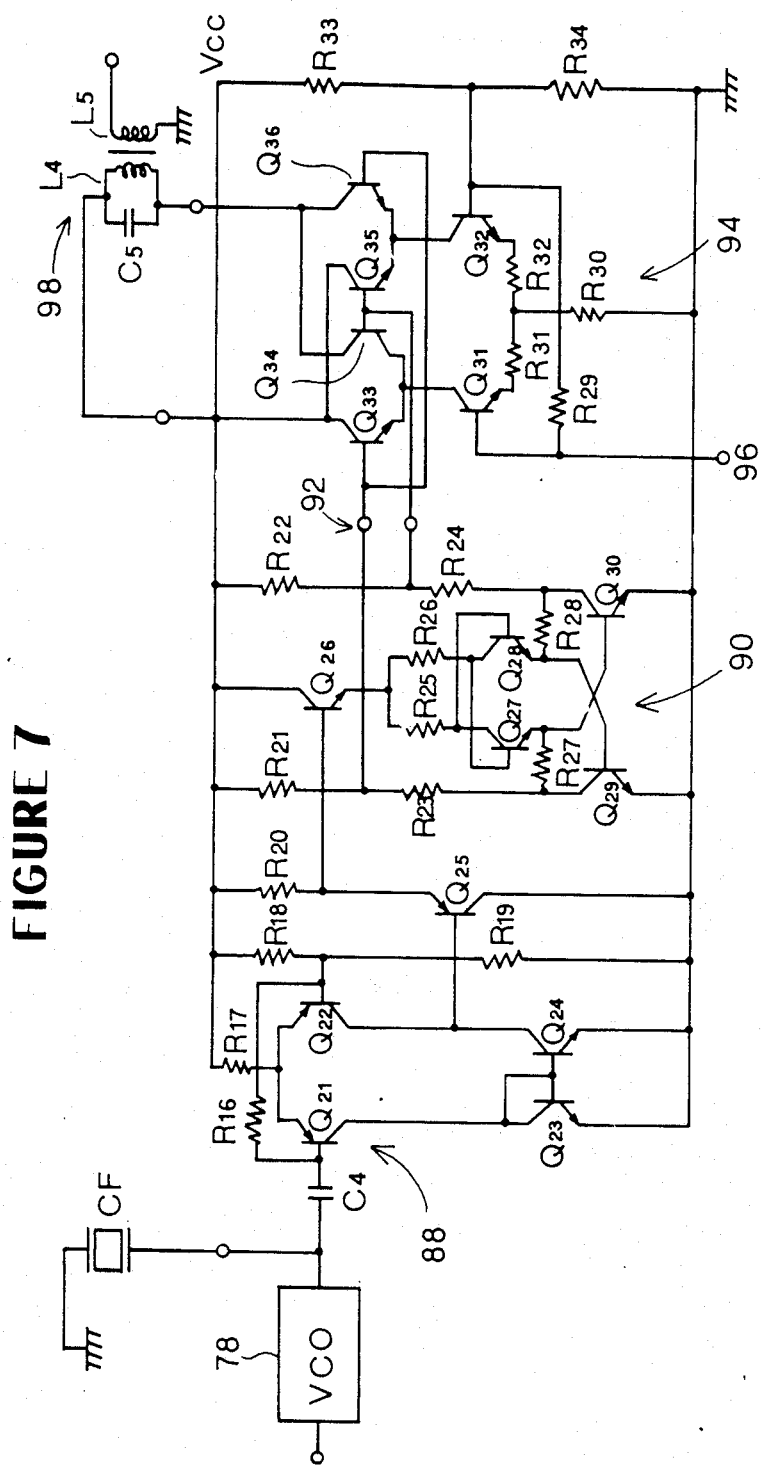
FIG. 7 is a specific circuit diagram showing in detail a portion of the circuit shown in FIG. 6.

Turning to FIG. 7, there is shown one example of specific circuits of the mixer 52, the first frequency divider 80 and a coupling portion between the voltage controlled oscillator 78 and the frequency divider 80. As seen from the drawing, the voltage controlled oscillator 78 is connected at its output with a two-terminal ceramic resonator or filter CF which has the resonance frequency of 608 KHz in this embodiment. The output of the voltage controlled oscillator 78 is also connected to a differential amplifier 88 through a CR high-pass filtering circuit consisting of a capacitor $C_4$ connected between the output of the voltage controlled oscillator 78 and one input of the differential amplifier 88 and a resistor $R_{16}$ connected between the one input and the other input of the differential amplifier 88. This differential amplifier 88 includes transistors $Q_{21}$, $Q_{22}$, $Q_{23}$, $Q_{24}$ and $Q_{25}$ and resistors $R_{17}$, $R_{18}$, $R_{19}$ and $R_{20}$ connected as shown in FIG. 7. Specifically, the transistor $Q_{21}$ consitutes the one input of the differential amplifier 88 while the transistor $Q_{22}$ constitutes the other input of the differential amplifier 88. The emitters of these transistors $Q_{21}$ and $Q_{22}$ are common-connected to the resistor $R_{17}$ which is in turn connected to a positive voltage $V_{cc}$. The base of the transistor $Q_{22}$ is biased by a voltage divider consisting of series-connected resistors $R_{18}$ and $R_{19}$. The collectors of the transistors $Q_{21}$ and $Q_{22}$ are connected to the ground through an active load constituted by the transistors $Q_{23}$ and $Q_{24}$. The connection node between the transistors $Q_{22}$ and $Q_{24}$ is connected to the base of the tansistor $Q_{25}$ whose collector is grounded and whose emitter is connected through the resistor $R_{20}$ to the positive voltage $V_{cc}$. The emitter of the transistor $Q_{25}$ constitutes an output connected to the frequency divider 80.

The frequency divider 80 includes an input transistor $Q_{26}$ and a toggle flipflop 90. The input transistor $Q_{26}$ is connected at its base to the emitter of the transistor $Q_{25}$ and has a collector connected to the positive voltage $V_{cc}$. The emitter of the input transistor $Q_{26}$ is connected through resistors $R_{25}$ and $R_{26}$, respectively to the collectors of transistors $Q_{27}$ and $Q_{28}$, which are cross-connected in such a manner that the base of each transistor is connected to the collector of the other transistor. The emitters of these transistors $Q_{27}$ and $Q_{28}$ are respectively connected to the bases of transistors $Q_{30}$ and $Q_{29}$, which are connected to the collector of the other transistor through the resistors $R_{27}$ and $R_{28}$ to form a bistable circuit as shown in the drawing. The collectors of the transistors $Q_{29}$ and $Q_{30}$ are also connected to the positive voltage $V_{cc}$ through the resistors $R_{21}$ and $R_{23}$ and the resistor $R_{22}$ and $R_{24}$, respectively. Thus, two signals opposite in phase to each other and having the frequency signal to a half of the input signal frequency are outputted from the connection between the resistors $R_{21}$ and $R_{23}$ and the connection between the resistor $R_{22}$ and $R_{24}$, respectively.

The pair of frequency-divided signals are connected to a pair of terminals 92 of the second input of the mixer 52. This mixer 52 includes a double-balanced differential amplifier type analog multiplier 94 which is the same as the multiplier 70 shown in FIG. 5. Namely, this multiplier 94 includes transistors $Q_{31}$, $Q_{32}$, $Q_{33}$, $Q_{34}$, $Q_{35}$ and $Q_{36}$ corresponding to the transistors $Q_{19}$, $Q_{20}$, $Q_{15}$, $Q_{16}$, $Q_{17}$ and $Q_{18}$, respectively, and resistors $R_{29}$, $R_{30}$, $R_{31}$, $R_{32}$, $R_{33}$ and $R_{34}$ corresponding to the resistors $R_9$, $R_{12}$, $R_{10}$, $R_{11}$, $R_{13}$ and $R_{14}$, respectively. A terminal 96 of the first input is connected to receive the output of the FM detector 22. In addition, the collector of the transistor $Q_{36}$, which provides an output of the multiplier 94, is connected to the positive voltage $V_{cc}$ through a tuned circuit 98 which has a resonance frequency corresponding to the center frequency of the AM intermediate-frequency amplifier. Similarly to the tuned circuit 68, this circuit 98 includes a capacitor $C_5$ and an intermediate-frequency transformer having a primary coil $L_4$ connected in parallel to the capacitor $C_5$ so as to form a LC parallel resonance circuit. The intermediate-frequency transformer also includes a secondary coil $L_5$ inductively coupled to the primary coil $L_4$ and adapted to form an input coil of the AM intermediate-frequency amplifier. Incidentally, this tuned circuit 98 can be replaced by a four-terminal ceramic filter as shown in FIG. 5A.

With this construction, the 608 KHz output of the voltage controlled oscillator 78 is amplified by the differential amplifier 88 and is then frequency-divided to a signal of 304 KHz by the toggle flipflop 90. The frequency divided signal of 304 KHz is applied to the second input of the analog multiplier 94 whose first input is connected to the output of the FM detector 52, so that the white noise component of $146 \pm 10$ KHz is converted into the noise signal of $450 \pm 10$ KHz and then outputted through the tuned circuit 98.

Figure 8:
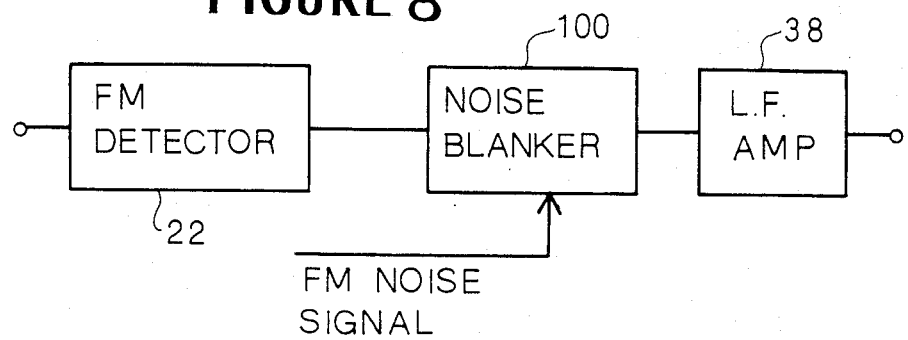
FIGS. 8 and 9 are block diagrams illustrating examples of utilizing the output of the FM noise level detecting circuit as shown in FIGS. 4 and 6.

The FM noise signal obtained in the aforementioned noise level detecting circuits can be used for various purposes. For example, the FM noise level signal can be used to control a noise blanking circuit 100 located between the output of the FM detector 22 and the low frequency amplifier 38, as shown in FIG. 8. The noise blanking circuit 100 is for eliminating pulse-like noise from the output signal of the FM detector. Therefore, this noise blanking circuit 100 is controlled on the basis of the FM noise signal in such a manner that the input signal is blanked during each momentary period of time the FM noise signal is higher than a predetermined voltage, which means the presence of pulse-like noise.

Figure 9:
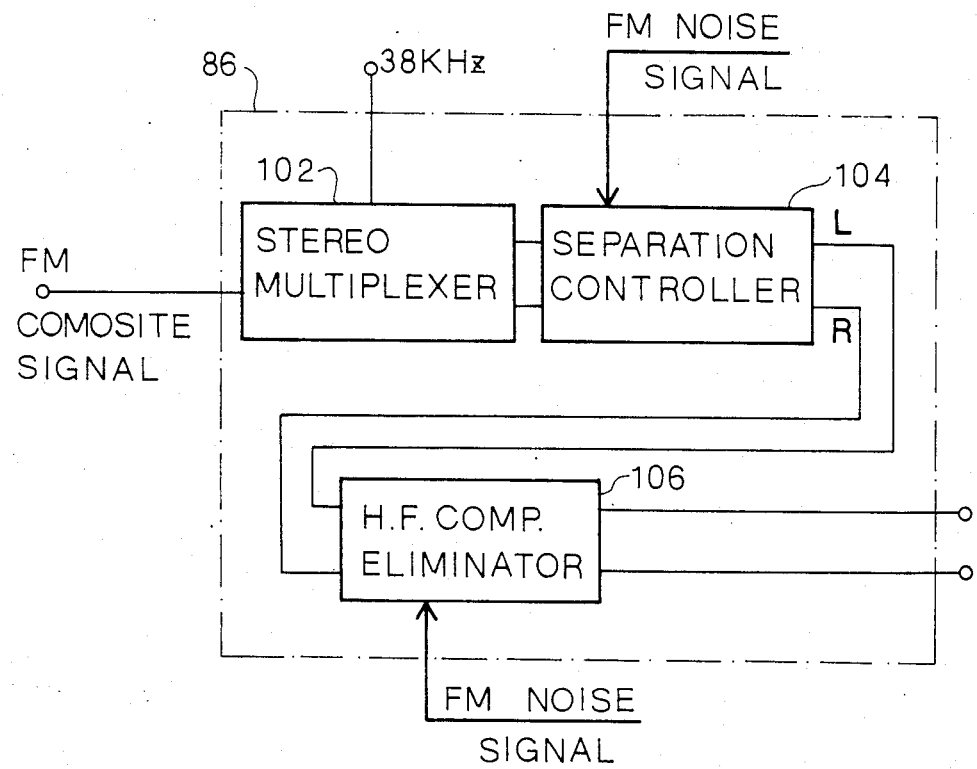

As shown in FIG. 9, the stereo decoder can comprise a multiplexer 102 followed by a separation controller 104. This separation controller 104 often includes a circuit for forcedly decreasing the degree of separation when the received FM signal is of not greater than an intermediate field strength. The reason for this is that when the received FM signal is weak, if the stereo demodulation is made at a high degree of separation, each reproduced channel signal is too weak. In this case, both reproduced channels can be made large by decreasing the degree of separation. For such a control, the FM noise signal can be used. Namely, the stereo separation controller is controlled on the basis of the FM noise signal in such a manner that the degree of the stereo separation is forcedly decreased when the FM noise signal indicates that the received FM signal is not greater than the intermediate field strength.

Furthermore, the stereo decoder can also includes a high frequency component eliminating circuit 106 for strongly suppressing a high frequency component when the received FM signal is very weak. This circuit 106 can also be controlled on the basis of the FM noise signal in such a manner that a high frequency component of the reproduced audio signal is forcedly strongly suppressed when the FM noise signal indicates that the received FM signal is not greater than a small field strength.

The invention has thus been shown and described with reference to specific embodiments. However, it should be noted that the invention is in no way limited to the details of the illustrated structures but changes and modifications may be made within the scope of the appended claims.

We claim:

1. A circuit for detecting the level of noises in received FM signals, for use in an AM/FM receiver which includes at least an FM intermediate-frequency amplifier, an FM detector connected thereto, an AM intermediate-frequency amplifier and an AM detector connected thereto, comprising:
    a frequency converting means receiving the output of the FM detector for converting noise components contained in the output of the FM detector into a noise signal of the AM intermediate-frequency and for outputting the converted noise signal to the AM intermediate-frequency amplifier, so that the converted noise signal is amplified by the AM intermediate-frequency amplifier and then detected by the AM detector thereby to provide a DC signal representative of the level of the noise contained in the received FM signal.

2. A circuit claimed in claim 1 further including a high-pass filter connected between the output of the FM detector and the frequency converting means and having a preselected cut-off frequency so that the frequency converting means is supplied with noise components of frequencies not smaller than the preselected cut-off frequency.

3. A circuit claimed in claim 2 wherein the preselected cut-off frequency of the high-pass filter is 100 KHz.

4. A circuit claimed in claim 1 wherein the frequency converting means includes a local oscillator means for generating a signal of a predetermined frequency different from the center frequency of the AM intermediate-frequency amplifier, and a mixer receiving at its first input the output of the FM detector and at its second input the output signal of the local oscillator for generating the frequency-converted noise signal having substantially the same frequency as the center frequency of the AM intermediate-frequency amplifier.

5. A circuit claimed in claim 4 wherein the mixer includes a level shift circuit having an input connected to receive the output of the FM detector through a first tuned circuit which has a resonance frequency substantially corresponding to the frequency of a noise component to be detected, and an analog multiplier having a first input connected to the output of the level shift circuit and a second input connected to the local oscillator, the multiplier having an output associated with a second tuned circuit having a resonance frequency corresponding to the center frequency of the AM intermediate-frequency amplifier.

6. A circuit claimed in claim 5 wherein the first tuned circuit includes a capacitor, a coil and a resistor connected in parallel to one another, and wherein the second tuned circuit includes a capacitor and an intermediate-frequency transformer having a primary coil connected in parallel to the second named capacitor to form a resonance circuit and also connected to the output terminal of the multiplier, the intermediate-frequency transformer also including a secondary coil inductively coupled to the primary coil for constituting an input coil of the AM intermediate-frequency amplifier.

7. A circuit claimed in claim 4 wherein the local oscillator means generates a signal of the frequency equal to the difference between the frequency of a noise component to be detected and the center frequency of the AM intermediate-frequency amplifier.

8. A circuit claimed in claim 7 wherein the local oscillator means generates a signal of 300 KHz, and the AM intermediate-frequency amplifier has the center frequency of 450 KHz.

9. A circuit claimed in claim 7 wherein the local oscillator means generates a signal of 304 KHz, and the AM intermediate-frequency amplifier has the center frequency of 450 KHz.

10. A circuit claimed in claim 4 wherein the local oscillator means generates a signal of the frequency equal to the sum of the frequency of a noise component to be detected and the center frequency of the AM intermediate-frequency amplifier.

11. A circuit claimed in claim 10 wherein the local oscillator means generates a signal of 608 KHz, and the AM intermediate-frequency amplifier has the center frequency of 450 KHz.

12. A circuit claimed in claim 4 further including a high-pass filter connected between the output of the FM detector and the mixer and having a preselected cut-off frequency so that the mixer is supplied with noise components of frequencies not smaller than the preselected cut-off frequency.

13. A circuit claimed in claim 12 wherein the high-pass filter includes a high pass filter circuit consisting of a capacitor connected at its one end to the output of the FM detector and a resistor connected at its one end to the other end of the capacitor, and a Darlington-connected solid state differential amplifier having a first input connected to the connection node between the capacitor and the resistor and a second input connected to the other end of the resistor, the Darlington-connected solid state differential amplifier being grounded through a constant current source.

14. A circuit claimed in claim 13 wherein the high-pass filter is connected to the mixer through a first tuned circuit having a resonance frequency substantially corresponding to the frequency of noise component to be detected, and wherein the mixture includes a level shift circuit having an input connected to the first turning circuit and an analog multiplier having a first input connected to the output of the level shift circuit and a second input connected to the local oscillator, the multiplier having an output associated with a second tuned circuit having a resonance frequency corresponding to the center frequency of the AM intermediate-frequency amplifier.

15. A circuit claimed in claim 14 wherein the first tuned circuit includes a capacitor, a coil and a resistor connected in parallel to one another, and wherein the second tuned circuit includes a capacitor and an intermediate-frequency transformer having a primary coil connected in parallel to the third named capacitor to form a resonance circuit and also connected to the output terminal of the multiplier, the intermediate-frequency transformer also including a secondary coil inductively coupled to the primary coil for constituting an input coil of the AM intermediate-frequency amplifier.

16. A circuit claimed in claim 14 wherein the first and second tuned circuits are ceramic filters, respectively.

17. A circuit claimed in claim 4 wherein the AM/FM receiver further includes an FM stereo demodulator of the phase locked loop type connected to receive the output of the FM detector and having a terminal for outputting a signal of the predetermined frequency generated in the course of reproducing stereophonic signals, the above mentioned terminal of the FM stereo demodulator being connected to the second input of the mixer.

18. A circuit claimed in claim 17 wherein the FM stereo demodulator includes a phase comparator connected at its one input to the output of the FM detector and adapted to receive a reference frequency at its second input, a voltage controlled oscillator connected at its input to the output of the phase comparator, a plurality of series-connected frequency divider stages whose first stage is connected to receive at its input the output of the voltage controlled oscillator, the final stage of the frequency divider stages being connected at its output to the second input of the phase comparator, and a stereo decoder connected to receive the output of the FM detector and the output of a predetermined one of the series-connected frequency divider stages for reproducing the above mentioned stereophonic signals, and wherein the local oscillator means is another predetermined one of the series-connected frequency divider stages from which the above mentioned predetermined frequency signal can be obtained.

19. A circuit claimed in claim 18 wherein the voltage controlled oscillator generates a signal of the frequency 608 KHz, wherein the first stage of the series-connected frequency divider stages is a ½ divider and is connected at its output to the second input of the mixer, and wherein the AM intermediate-frequency amplifier has a center frequency of 450 KHz.

20. A circuit claimed in claim 18 wherein the FM stereo modulator further includes a loop filter connected between the phase comparator and the voltage controlled oscillator.

21. A circuit claimed in claim 18 wherein the output of the voltage controlled oscillator is connected with a tuned circuit.

22. A circuit claimed in claim 21 wherein the tuned circuit connected to the output of the voltage controlled oscillator is a ceramic filter.

23. A circuit claimed in claim 17 wherein the output of the voltage controlled oscillator is connected through a high-pass filter and a differential amplifier to the first frequency divider stage, the high-pass filter including a high-pass filtering circuit consisting of a capacitor connected at its one end to the output of the voltage controlled oscillator and a resistor connected at its one end to the other end of the capacitor, the differential amplifier having a first input connected to the connection node between the capacitor and the resistor and a second input connected to the other end of the resistor, the differential amplifier being grounded through an active load, and an output transistor being connected between the output of the differential amplifier and the input of the first frequency divider stage.

24. A circuit claimed in claim 23 wherein the first frequency divider stage includes an input transistor connected to the output transistor of the differential amplifier and a toggle flipflop having a single input connected to the input transistor and a pair of output terminals adapted to supply output signals opposite in phase to each other.

25. A circuit claimed in claim 24 wherein the mixer includes a double-balanced differential amplifier type analog multiplier having a pair of first inputs connected to the pair of output terminals of the toggle flipflop in the first frequency divider stage and a second input connected to the FM detector, the multiplier also having an output associated with a tuned circuit having a resonance frequency corresponding to the center frequency of the AM intermediate-frequency amplifier.

26. A circuit claimed in claim 25 wherein the multiplier has a pair of output terminals and wherein the turned circuit includes a capacitor and an intermediate-frequency transformer having a primary coil connected in parallel to the capacitor to form a resonance circuit and also connected across the pair of output terminals of the multiplier, the intermediate-frequency transformer also including a secondary coil inductively coupled to the primary coil for constituting an input coil of the AM intermediate-frequency amplifier.

27. A circuit for detecting the level of noises in received FM signals, for use in an AM/FM receiver which includes at least an FM intermediate-frequency amplifier, an FM detector connected thereto, a FM stereo demodulator of the phase locked loop type connected to receive the output of the FM detector for reproducing stereophonic signals, an AM intermediate-frequency amplifier and an AM detector connected thereto, comprises:

the FM stereo demodulator having a terminal for outputting a signal of a predetermined frequency which is generated in the course of reproducing the stereophonic signals and which is different from the center frequency of the AM intermediate-frequency amplifier, and a mixer receiving at its first input the output of the FM detector and at its second input the predetermined frequency signal from the FM stereo demodulator for converting noise components contained in the output of the FM detector into a noise signal of the AM intermediate-frequency and for outputting the converted noise signal to the AM intermediate-frequency amplifier, so that the converted noise signal is amplified by the AM intermediate-frequency amplifier and then detected by the AM detector thereby to provide a DC signal representative of the level of the noise contained in the received FM signal.

28. A circuit claimed in claim 27 wherein the predetermined frequency signal outputted from the FM demodulator is a signal of the frequency equal to the difference between the frequency of a noise component to be detected and the center frequency of the AM intermediate-frequency amplifier.

29. A circuit claimed in claim 28 wherein the predetermined frequency signal outputted from the FM demodulator is a signal of 304 KHz, and the AM intermediate-frequency amplifier has the center frequency of 450 KHz.

30. A circuit claimed in claim 27 wherein the predetermined frequency signal outputted from the FM demodulator is a signal of the frequency equal to the sum of the frequency of a noise component to be detected and the center frequency of the AM intermediate-frequency amplifier.

31. A circuit claimed in claim 30 wherein the predetermined frequency signal outputted from the FM demodulator is a signal of 608 KHz, and the AM intermediate-frequency amplifier has the center frequency of 450 KHz.

32. A circuit claimed in claim 27 wherein the FM stereo demodulator includes a phase comparator connected at its one input to the output of the FM detector and adapted to receive a reference frequency at its second input, a voltage controlled oscillator connected at its input to the output of the phase comparator, a plurality of series-connected frequency divider stages whose first stage is connected to receive at its input the output of the voltage controlled oscillator, the final stage of the frequency divider stages being connected at its output to the second input of the phase comparator, and a stereo decoder connected to receive the output of the FM detector and the output of a predetermined one of the series-connected frequency divider stages for reproducing the abovementioned stereophonic signals, and wherein the second input of the mixer is connected to another predetermined one of the series-connected frequency divider stages from which the above mentioned predetermined frequency signal can be obtained.

33. A circuit claimed in claim 32 wherein the voltage controlled oscillator generates a signal of 608 KHz, wherein the first stage of the series-connected frequency divider stages is a ½ divider and is connected at its output to the second input of the mixer, and wherein the AM intermediate-frequency amplifier has a center frequency of 450 KHz.

34. A circuit claimed in claim 32 wherein the FM stereo demodulator further includes a loop filter connected between the phase comparator and the voltage controlled oscillator.

35. A circuit claimed in claim 32 wherein the output of the voltage controlled oscillator is connected with a tuned circuit.

36. A circuit claimed in claim 35 wherein the tuned circuit connected to the output of the voltage controlled oscillator is a ceramic filter.

37. A circuit claimed in claim 34 wherein the output of the voltage controlled oscillator is connected through a high-pass filter and a differential amplifier to the first frequency divider stage, the high-pass filter including a high-pass filtering circuit consisting of a capacitor connected at its one end to the output of the voltage controlled oscillator and a resistor connected at its one end to the other end of the capacitor, the differential amplifier having a first input connected to the connection node between the capacitor and the resistor and a second input connected to the other end of the resistor, the differential amplifier being grounded through an active load, and an output transistor being connected between the output of the differential amplifier and the input of the first frequency divider stage.

38. A circuit claimed in claim 37 wherein the first frequency divider stage includes an input transistor connected to the output transistor of the differential amplifier and a toggle flipflop having a single input connected to the input transistor and a pair of output terminals adapted to supply output signals opposite in phase to each other.

39. A circuit claimed in claim 38 wherein the mixer includes a double-balanced differential amplifier type analog multiplier having a pair of first inputs connected to the pair of output terminals of the toggle flipflop in the first frequency divider stage and a second input connected to the FM detector, the multiplier also having an output associated with a tuned circuit having a resonance frequency corresponding to the center frequency of the AM intermediate-frequency amplifier.

40. A circuit claimed in claim 39 wherein the multiplier has a pair of output terminals and wherein the turned circuit includes a capacitor and an intermediate-frequency transformer having a primary coil connected in parallel to the capacitor to form a resonance circuit and also connected across the pair of output terminals of the multiplier, the intermediate-frequency transformer also including a secondary coil inductively coupled to the primary coil for constituting an input coil of the AM intermediate-frequency amplifier.

41. An AM/FM receiver which includes an AM receiver section having at least an AM frequency converter for converting a received radio frequency AM signal into an AM intermediate-frequency signal, an AM intermediate-frequency amplifier for amplifying the converted AM intermediate-frequency signal, and an AM detector for demodulating the amplified AM intermediate-frequency signal to reproduce a low-frequency signal; an FM receiver section having at least an FM frequency converter for converting a received radio frequency FM signal into an FM intermediate-frequency signal, an FM intermediate-frequency amplifier for amplifying the converted FM intermediate-frequency signal, and an FM detector for demodulating the amplified FM intermediate-frequency signal to reproduce a low-frequency signal; and an audio outputting section having a low-frequency amplifier selectively receiving either the output of the AM detector or the output of the FM detector and for amplifying the received low-frequency signal, and electroacoustic transducing means receiving the amplified low-frequency signal for converting it into an acoustic output, comprising:

a circuit receiving, when the FM receiver section is in an operative condition, the output of the FM detector for converting noise components contained in the output of the FM detector into a noise signal of the AM intermediate-frequency and for outputting the converted noise signal to the AM intermediate-frequency amplifier, so that the converted noise signal is amplified by the AM intermediate-frequency amplifier and then detected by the AM detector thereby to provide a DC signal representative of the level of the noise contained in the received FM signal.

42. An AM/FM receiver as claimed in claim 41 further including noise blanking means located between the output of the FM detector and the low frequency amplifier for eliminating pulse-like noises from the output signal of the FM detector, the noise blanking means being controlled by the signal from the AM detector.

43. An AM/FM receiver as claimed in claim 41 further including a stereo demodulator receiving the output of the FM detector for generating a pair of stereophonic signals, the low frequency amplifier including a pair of amplifiers which receive and amplify the pair of stereophonic signals, respectively, and the electroacoustic transducing means including at least a pair of electroacoustic transducers receiving the pair of amplified stereophonic signals, respectively, and wherein the stereo demodulator includes a stereo separation controller adapted to adjust the degree of stereo separation on the basis of the output from the FM noise level detecting circuit so that the degree of stereo separation is forcedly decreased when the FM noise signal indicates that the received FM signal is not greater than an intermediate field strength.

44. An AM/FM receiver as claimed in claim 43 wherein the stereo demodulator further includes a high frequency component eliminating circuit controlled on the basis of the output from the FM noise level detecting circuit so that a high frequency component is more strongly suppressed when the FM noise signal indicates that the received FM signal is not greater than a small field strength.

45. An AM/FM receiver as claimed in claim 41 further including a stereo demodulator of the phase locked loop type receiving the output of the FM detector for generating a pair of stereophonic signals, the low frequency amplifier including a pair of amplifiers which receive and amplify the pair of stereophonic signals, respectively, and the electroacoustic transducing means including at least a pair of electroacoustic transducers receiving the pair of amplified stereophonic signals, respectively, and wherein the FM stereo demodulator has a terminal for outputting a signal of a predetermined frequency which is generated in the course of reproducing the stereophonic signals and which is different from the center frequency of the AM intermediate-frequency amplifier, and the FM noise level detecting circuit includes a mixer receiving at its first input the output of the FM detector and at its second input the predetermined frequency signal from the FM stereo demodulator for converting noise components contained in the output of the FM detector into a signal of the AM intermediate-frequency and for outputting the converted noise signal to the AM intermediate-frequency amplifier.

46. A circuit claimed in claim 45 wherein the FM stereo demodulator includes a phase comparator connected at its one input to the output of the FM detector and adapted to receive a reference frequency at its second input, a voltage controlled oscillator connected at its input to the output of the phase comparator, a plurality of series-connected frequency divider stages whose first stage is connected to receive at its input the output of the voltage controlled oscillator, the final stage of the frequency divider stages being connected at its output to the second input of the phase comparator, and a stereo decoder connected to receive the output of the FM detector and the output of a predetermined one of the series-connected frequency divider stages for reproducing the above mentioned stereophonic signals, and wherein the second input of the mixer is connected to another predetermined one of the series-connected frequency divider stages from which the above mentioned predetermined frequency signal can be obtained.

47. A circuit claimed in claim 46 wherein the voltage controlled oscillator generates a signal of 608 KHz, wherein the first stage of the series-connected frequency divider stages is a ½ divider and is connected at its output to the second input of the mixer, and wherein the AM intermediate-frequency amplifier has a center frequency of 430 KHz.

48. A circuit claimed in claim 46 wherein the output of the voltage controlled oscillator is connected through a high-pass filter and a differential amplifier to the first frequency divider stage, the high-pass filter including a high-pass filtering circuit consisting of a capacitor connected at its one end to the output of the voltage controlled oscillator and a resistor connected at its one end to the other end of the capacitor, the differential amplifier having a first input connected to the connection node between the capacitor and the resistor and a second input connected to the other end of the resistor, the differential amplifier being grounded through an active load, and an output transistor being connected between the output of the differential amplifier and the input of the first frequency divider stage.

49. A circuit claimed in claim 48 wherein the first frequency divider stage includes an input transistor connected to the output transistor of the differential amplifier and a toggle flipflop having a single input connected to the input transistor and a pair of output terminals adapted to supply output signals opposite in phase to each other.

50. A circuit claimed in claim 49 wherein the mixer includes a double-balanced differential amplifier type analog multiplier having a pair of first inputs connected to the pair of output terminals of the toggle flipflop in the first frequency divider stage and a second input connected to the FM detector, the multiplier also having an output associated with a tuned circuit having a resonance frequency corresponding to the center frequency of the AM intermediate-frequency amplifier.

51. A circuit claimed in claim 50 wherein the multiplier has a pair of output terminals and wherein the tuned circuit includes a capacitor and an intermediate-frequency transformer having a primary coil connected in parallel to the capacitor to form a resonance circuit and also connected across the pair of output terminals of the multiplier, the intermediate-frequency transformer also including a secondary coil inductively coupled to the primary coil for constituting an input coil of the AM intermediate-frequency amplifier.

* * * * *